United States Patent
Godet et al.

(10) Patent No.: US 8,664,098 B2
(45) Date of Patent: *Mar. 4, 2014

(54) PLASMA PROCESSING APPARATUS

(75) Inventors: Ludovic Godet, Boston, MA (US); Timothy J. Miller, Ipswich, MA (US); Svetlana B. Radovanov, Brookline, MA (US); Anthony Renau, West Newbury, MA (US); Vikram Singh, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 178 days.

This patent is subject to a terminal disclaimer.

(21) Appl. No.: 13/353,993

(22) Filed: Jan. 19, 2012

(65) Prior Publication Data

US 2012/0111834 A1 May 10, 2012

Related U.S. Application Data

(63) Continuation of application No. 12/644,103, filed on Dec. 22, 2009, now Pat. No. 8,101,510, which is a continuation-in-part of application No. 12/418,120, filed on Apr. 3, 2009.

(51) Int. Cl.
*H01L 21/26* (2006.01)
*C23F 1/00* (2006.01)
*C23C 16/00* (2006.01)
*H01L 21/3065* (2006.01)

(52) U.S. Cl.
USPC ... 438/513; 438/511; 156/345.51; 118/723 R; 257/E21.328

(58) Field of Classification Search
USPC ............ 438/511, 513, 710; 118/723 R; 156/345.24

See application file for complete search history.

(56) References Cited

U.S. PATENT DOCUMENTS 8,101,510 B2 * 1/2012 Godet et al. ............ 438/513

* cited by examiner

*Primary Examiner* — Angel Roman

(57) ABSTRACT

A plasma processing apparatus includes a process chamber, a platen for supporting a workpiece, a source configured to generate a plasma in the process chamber, and an insulating modifier. The insulating modifier has a gap, and a gap plane, where the gap plane is defined by portions of the insulating modifier closest to the sheath and proximate the gap. A gap angle is defined as the angle between the gap plane and a plane defined by the front surface of the workpiece. Additionally, a method of having ions strike a workpiece is disclosed, where the range of incident angles of the ions striking the workpiece includes a center angle and an angular distribution, and where the use of the insulating modifier creates a center angle that is not perpendicular to the workpiece.

17 Claims, 16 Drawing Sheets

PLASMA PROCESSING APPARATUS

CROSS REFERENCE TO RELATED APPLICATIONS

This application is a continuation of prior U.S. application Ser. No. 12/644,103, filed Dec. 22, 2009, which itself is a continuation in part (CIP) of U.S. application Ser. No. 12/418,120, filed Apr. 3, 2009, all of which are incorporated herein by reference.

This application is also related to U.S. application Ser. No. 12/417,929 filed Apr. 3, 2009, which is incorporated herein, by reference.

FIELD

This disclosure relates to plasma processing, and more particularly to a plasma processing apparatus.

BACKGROUND

A plasma processing apparatus generates a plasma in a process chamber tor treating a workpiece supported, by a platen in the process chamber. A plasma processing apparatus may include, but not be limited to, doping systems, etching systems, and deposition systems. The plasma is generally a quasi-neutral collection of ions (usually having a positive charge and electrons (having a negative charge. The plasma has an electric field of about 0 volts per centimeter in the bulk of the plasma. In some plasma processing apparatus, ions from the plasma are attracted, towards a workpiece. In a plasma doping apparatus, runs may be attracted with sufficient energy to be implanted into the physical structure of the workpiece, e.g., a semiconductor substrate in one instance.

The plasma is bounded by a region proximate the workpiece generally referred to as a plasma sheath. The plasma sheath is a region that has fewer electrons than the plasma. The light emission from this plasma sheath is less intense than the plasma since fewer electrons are present and hence few excitation-relaxation collisions occur. Hence, the plasma sheath is sometimes referred to as "dark space."

Turning to FIG. 1, a cross sectional view of portions of a known plasma processing apparatus is illustrated where a plasma 140 has a plasma sheath 142 adjacent to a front surface of a workpiece 138 to be treated. The front surface of the workpiece 138 defines a plane 151, and the workpiece 138 is supported by a platen 134. The boundary 141 between the plasma 140 and the plasma sheath 142 is parallel to the plane 151. Ions 102 from the plasma 140 may be attracted across the plasma sheath 142 towards the workpiece 138. Accordingly, the ions 102 that are accelerated towards the workpiece 138 generally strike the workpiece 138 at about a 0° angle of incidence relative to the plane 151 (e.g., perpendicular to the plane 151). There can be a small angular spread of the angle of incidence of less than about 3°. In addition, by controlling plasma, process parameters such as gas pressure within a process chamber, the angular spread may be increased up to about 5°.

A drawback with, conventional plasma processing is the lack of angular spread control of the ions 102. As structures on the workpiece become smaller and as three dimensional structures become more common (e.g., trench capacitors, vertical channel transistors such as FinFETs) it would be beneficial to have greater angle control. For example, a trench 144 having an exaggerated size for clarity of illustration is shown in FIG. 1. With ions 102 being directed at about a 0° angle of incidence or an even angular spread up to 5°, it can be difficult to uniformly treat the sidewalls 147 of the trench 144.

Accordingly, there is a need for a plasma processing apparatus which overcomes the above-described inadequacies and shortcomings.

SUMMARY

According to a first aspect of the disclosure, a plasma processing apparatus is provided. The plasma processing apparatus includes a process chamber, a platen for supporting a workpiece, a source configured to generate a plasma in the process chamber, and an insulating modifier. The insulating modifier has a gap, and a gap plane, where the gap plane is defined by portions of the insulating modifier closest to the sheath and proximate the gap. A gap angle is defined as the angle between the gap plane and a plane defined by the front surface of the workpiece facing the plasma. The gap angle created using the insulating modifier is non-zero.

According to another aspect of the disclosure, a method is provided. The method includes generating a plasma having a plasma sheath, modifying a shape of a boundary between the plasma and the plasma sheath with an insulating modifier, and accelerating ions from the plasma across the plasma sheath. The range of incident angles of the ions relative to a workpiece plane is influenced by the shape of the boundary between the plasma and the plasma sheath. This range of incident angles of the ions includes a center angle and an angular distribution, such that the use of the insulating modifier creates a center angle that is not perpendicular to said workpiece.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 2:
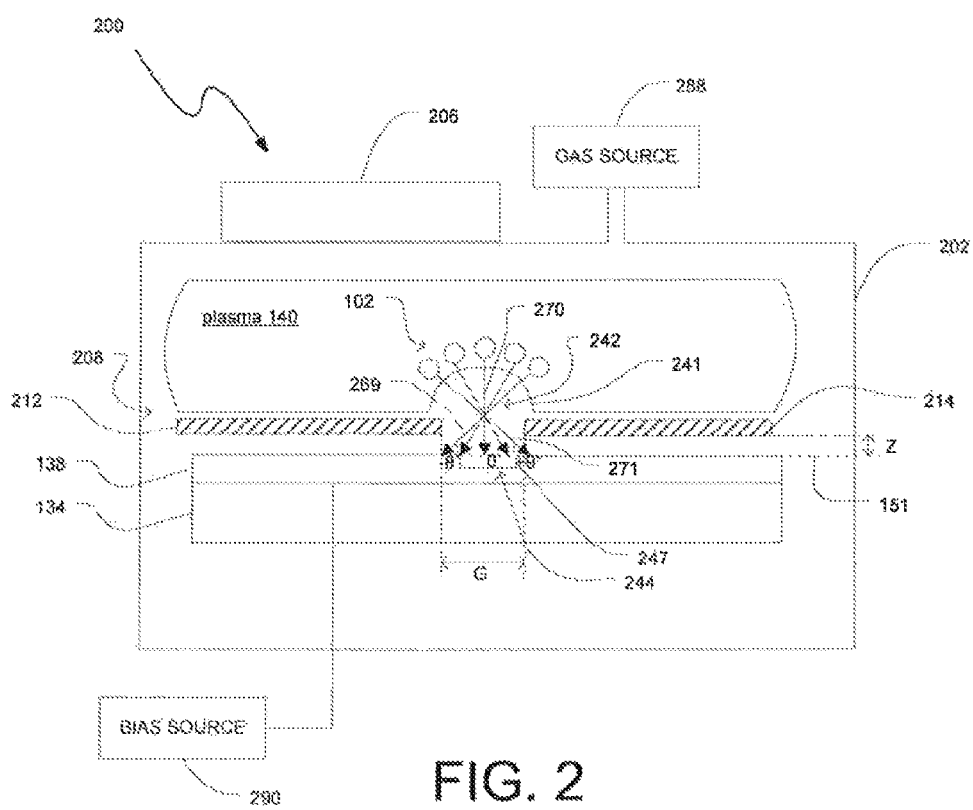
FIG. 2 is a block diagram of a plasma processing apparatus consistent with an embodiment of the disclosure.

FIG. 2 is a block diagram of one plasma processing apparatus 200 having an insulating modifier 208 consistent with an embodiment of the disclosure. The insulating modifier 208 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 138 at a range of incident angles.

The plasma processing apparatus 200 may be further described herein as a plasma doping apparatus. However, the plasma processing apparatus 200 may also include, but not be limited to, etching and deposition systems. Furthermore, a plasma doping system can perform many differing material modification processes on a treated workpiece. One such process includes doping a workpiece, such as a semiconductor substrate, with a desired dopant.

The plasma processing apparatus 200 may include a process chamber 202, a platen 134, a source 206, and the insulating modifier 208. The platen 134 is positioned in the process chamber 202 for supporting the workpiece 138. The workpiece may include, but not be limited to, a semiconductor wafer, flat panel, solar panel, and polymer substrate. The semiconductor wafer may have a disk shape with a diameter of 300 millimeters (mm) in one embodiment. The source 206 is configured to generate the plasma 140 in the process chamber 202 as is known in the art. In the embodiment of FIG. 2, the insulating modifier 208 includes a pair of insulators 212 and 214 defining a gap there between having a horizontal spacing (G). In other embodiments, the insulating modifier may include only one insulator. The pair of insulators 212 and 214 may be a pair of sheets having a thin, flat shape. In other embodiments, the pair of insulators 212 and 214 may be other shapes such as tube shaped, wedge shaped, and/or have a beveled edge proximate the gap.

In one embodiment, the horizontal spacing of the gap defined by the pair of insulators 212 and 214 may be about 6.0 millimeters (mm). The pair of insulators 212 and 214 may also be positioned a vertical spacing (Z) above the plane 151 defined by the front surface of the workpiece 138. In one embodiment, the vertical spacing (Z) may be about 3.0 mm.

In operation, a gas source 288 supplies an ionizable gas to the process chamber 202. Examples of an ionizable gas include, but are not limited to, $BF_3$, $BI_3$, $N_2$, $Ar$, $PH_3$, $AsH_3$, $B_2H_6$, $H_2$, $Xe$, $Kr$, $Ne$, $He$, $SiH_4$, $SiF_4$, $GeH_4$, $GeF_4$, $CH_4$, $CF_4$, $AsF_5$, $PF_3$, and $PF_5$. The source 206 may generate the plasma 140 by exciting and ionizing the gas provided to the process chamber 202. Ions may be attracted from the plasma 140 across the plasma sheath 242 by different mechanisms. In the embodiment of FIG. 2, the bias source 290 is configured to bias the workpiece 138 to attract ions 102 from the plasma 140 across the plasma sheath 242. The bias source 290 may be a DC power supply to provide a DC voltage bias signal or an RF power supply to provide an RF bias signal.

Figure 1:
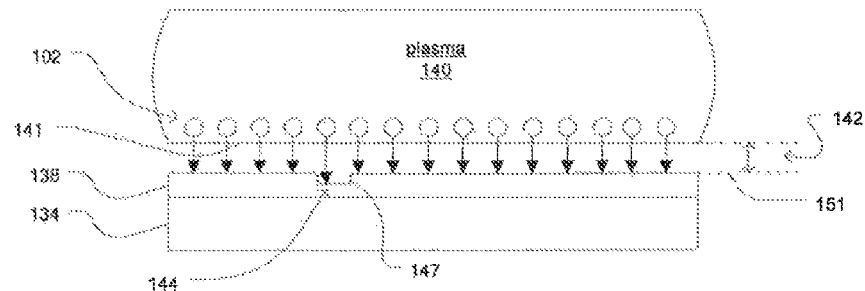
FIG. 1 is a simplified block diagram of a conventional plasma processing apparatus consistent with the prior art.

Advantageously, the insulating modifier 208 modifies the electric field within the plasma sheath 242 to control a shape of the boundary 241 between the plasma 140 and the plasma sheath 242. In the embodiment of FIG. 2, the insulating modifier 208 includes a pair of insulators 212 and 214. The insulators 212, 214 may be fabricated of quartz, alumina, boron nitride, glass, silicon, nitride, etc. The boundary 241 between the plasma 140 and the plasma sheath 242 may have a convex shape relative to the plane 151. When the bias source 290 biases the workpiece 138, ions 102 are attracted across the plasma sheath 242 through the gap between the insulators 212 and 214 at a large range of incident angles. For instance, ions following trajectory path 271 may strike the workpiece 138 at an angle of $+\theta°$ relative to the plane 151. Ions following trajectory path 270 may strike the workpiece 138 at about an angle of 0° relative to the same plane 151. Ions following trajectory path 269 may strike the workpiece 138 an angle of $-\theta°$ relative to the plane 151. Accordingly, the range of incident angles may be between $+\theta°$ and $-\theta°$ centered about 0°. In addition, some ion trajectories paths such as paths 269 and 271 may cross each other. Depending on a number of factors including, but not limited to, the horizontal spacing (G) between the insulators 212 and 214, the vertical spacing (Z) of the insulators above the plane 151, the dielectric constant of the insulators 212 and 214, and other plasma process parameters, the range of incident angles ($\theta$) may be between $+60°$ and $-60°$ centered about 0°. Hence, small three dimensional structures on the workpiece 138 may be treated uniformly by the ions 102. For example, the sidewalls 247 of the trench 244 having an exaggerated size for clarity of illustration may be more uniformly treated by the ions 102 compared to that of FIG. 1.

Figure 3:
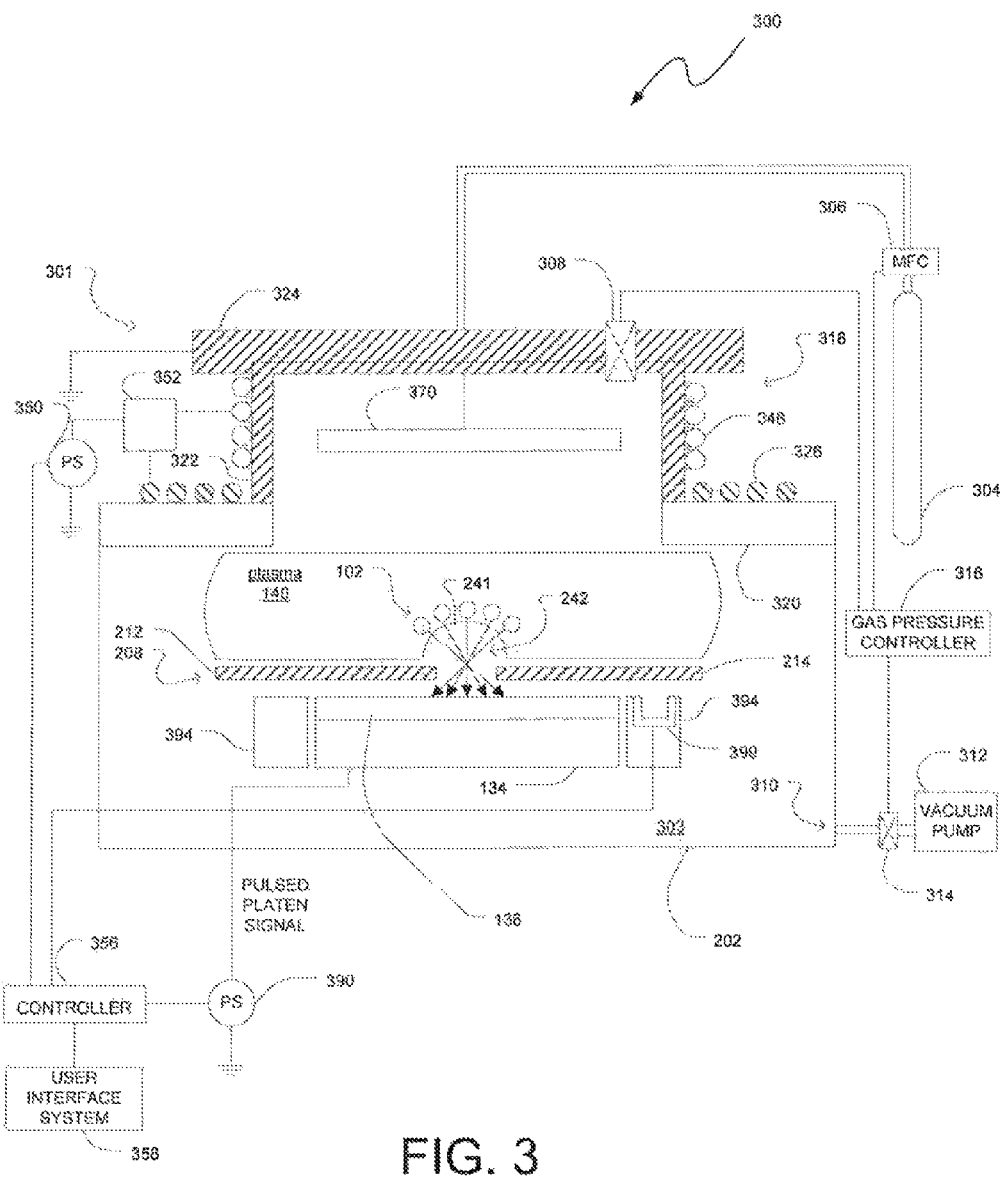
FIG. 3 is a block diagram of a plasma doping apparatus consistent with an embodiment of the disclosure.

Turning to FIG. 3, a block diagram of one exemplary plasma doping apparatus 300 is illustrated. Consistent with the apparatus of FIG. 2, the plasma doping apparatus 300 has the pair of insulators 212 and 214 to control a shape of the boundary 241 between the plasma 140 and the plasma sheath 242.

The plasma doping apparatus 300 includes a process chamber 202 defining an enclosed volume 303. A gas source 304 provides a primary dopant gas to the enclosed volume 303 of the process chamber 302 through the mass flow controller 306. A gas baffle 370 may be positioned in the process chamber 202 to deflect the flow of gas from the gas source 304. A pressure gauge 308 measures the pressure inside the process chamber 202. A vacuum pump 312 evacuates exhausts from the process chamber 202 through an exhaust port 310. An exhaust valve 314 controls the exhaust conductance through the exhaust port 310.

The plasma doping apparatus 300 may further includes a gas pressure controller 316 that is electrically connected to the mass flow controller 306, the pressure gauge 308, and the exhaust valve 314. The gas pressure controller 316 may be configured to maintain a desired pressure in the process chamber 202 by controlling either the exhaust conductance with the exhaust valve 314 or a process gas flow rate with the mass flow controller 306 in a feedback loop that is responsive to the pressure gauge 308.

The process chamber 202 may have a chamber top 318 that includes a first section 320 formed of a dielectric material that extends in a generally horizontal direction. The chamber top 318 also includes a second section 322 formed of a dielectric material that extends a height from the first section 320 in a generally vertical direction. The chamber top 318 further includes a lid 324 formed of an electrically and thermally conductive material that extends across the second section 322 in a horizontal direction.

The plasma doping apparatus further includes a source 301 configured to generate a plasma 140 within the process chamber 202. The source 301 may include a RF source 350 such as a power supply to supply RF power to either one or both of the planar antenna 326 and the helical antenna 346 to generate the plasma 140. The RF source 350 may be coupled to the antennas 326, 346 by an impedance matching network 352 that matches the output impedance of the RF source 350 to the impedance of the RF antennas 326, 346 in order to maximize the power transferred from the RF source 350 to the RF antennas 326, 346.

The plasma doping apparatus may also include a bias power supply 390 electrically coupled to the platen 134. The plasma eloping system may further include a controller 356 and a user-interface system 358. The controller 356 can be or include a general-purpose computer or network of general-purpose computers that may be programmed to perform desired input/output functions. The controller 356 may also include communication devices, data storage devices, and software. The user interface system 358 may include devices such as touch screens, keyboards, user pointing devices, displays, printers, etc. to allow a user to input commands and/or data and/or to monitor the plasma doping apparatus via the controller 356. A shield ring 394 may be disposed around the platen 134 to improve the uniformity of implanted ion distribution near the edge of the workpiece 138. One or more Faraday sensors such as Faraday cup 399 may also be positioned in the shield ring 394 to sense ion beam current.

In operation, the gas source 304 supplies a primary dopant gas containing a desired dopant for implantation into the workpiece 138. The source 301 is configured to generate the plasma 140 within the process chamber 302. The source 301 may be controlled by the controller 356. To generate the plasma 140, the RF1 source 350 resonates RF currents in at least one of the RF antennas 326, 346 to produce an oscillating magnetic field. The oscillating magnetic field induces RF currents into the process chamber 202. The RF currents in the process chamber 202 excite and ionize the primary dopant gas to generate the plasma 140.

The bias power supply 390 provides a pulsed platen signal having a pulse ON and OFF periods to bias the platen 134 and hence the workpiece 138 to accelerate ions from the plasma 140 towards the workpiece 138 across the plasma sheath 242. The ions 102 may be positively charged ions and hence the pulse ON periods of the pulsed platen signal may be negative voltage pulses with respect to the process chamber 202 to attract the positively charged ions 102. The frequency of the pulsed platen signal and/or the duty cycle of the pulses may be selected to provide a desired dose rate. The amplitude of the pulsed platen signal may be selected to provide a desired energy.

Advantageously, the pair of insulators 212 and 214 controls the shape of the boundary 241 between the plasma 140 and the plasma sheath 242 as previously detailed with respect to FIG. 2. Therefore, the ions 102 may be attracted across the plasma sheath 242 through the gap between the insulators 212 and 214 at a large range of incident angles for doping the workpiece 138.

Figure 4:
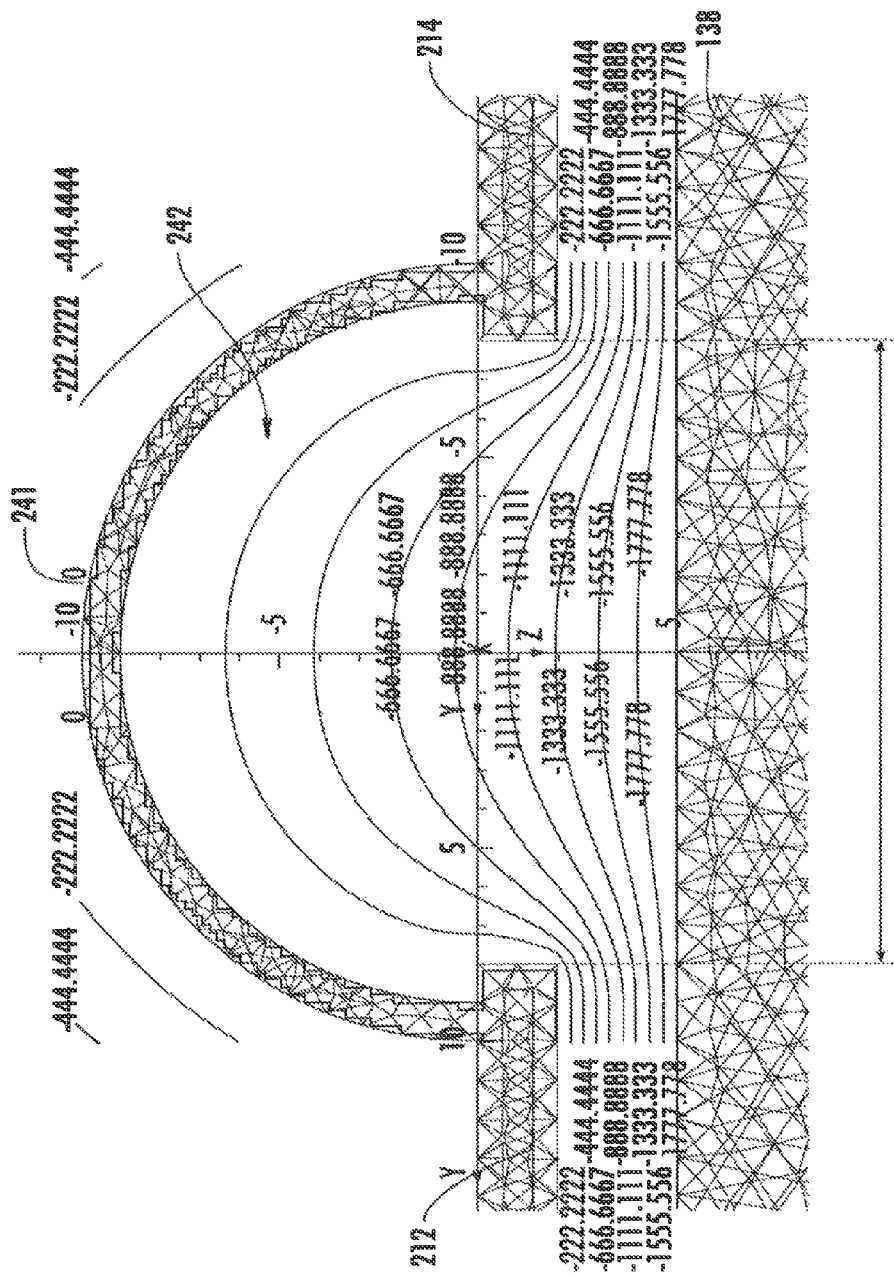
FIG. 4 is a cross sectional view of a pair of insulators to control a shape of a boundary between a plasma and a plasma sheath.

Turning to FIG. 4, a partial cross sectional view of the pair of insulators 212 and 214 and workpiece 138 is illustrated showing the electric field lines in the plasma sheath 242 about the gap defined by the insulators 212 and 214. The electric field lines and resulting arcuate boundary 241 between the plasma and the plasma sheath 242 resulted from a computer simulation with the workpiece 138 biased at −2,000 volts and the insulators 212 and 214 fabricated of glass. As illustrated, the arcuate boundary 241 about the gap may further have a convex shape relative to the plane 151.

Figure 5:
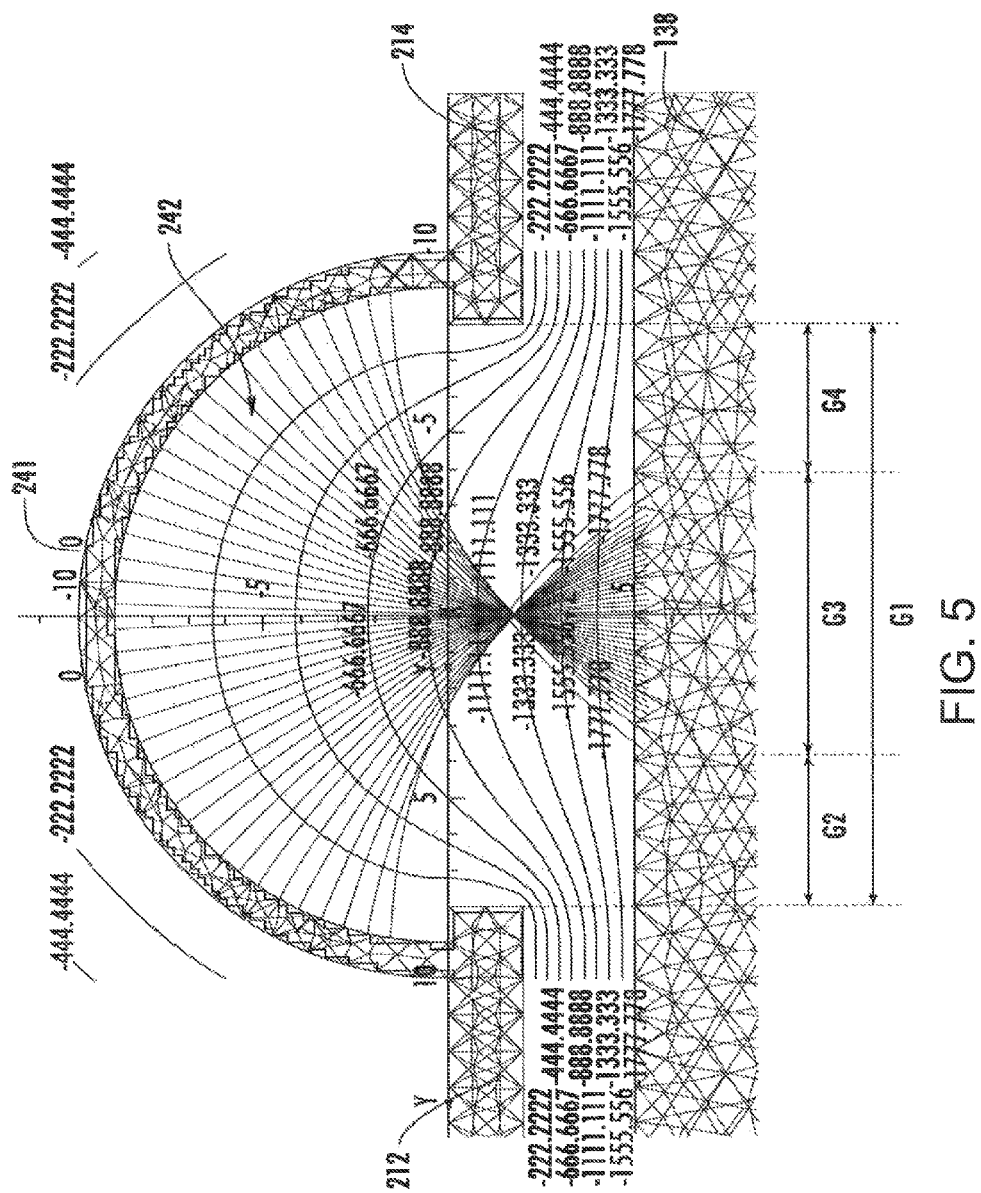
FIG. 5 is a cross sectional view consistent with FIG. 4 illustrating ion trajectories of ions accelerated across the boundary of FIG. 4.

FIG. 5 is a cross sectional view consistent with FIG. 4 illustrating simulated ion trajectories accelerated across the plasma sheath 242 through the gap between the insulators 212 and 214. In a plasma doping apparatus, the ions may be implanted in the workpiece 138 in a central area of the gap spacing due to the shape of the boundary 241 and the electric field lines within the plasma sheath 242. For instance, of the total horizontal spacing (G1) between the insulators 212 and 214, ions strike the workpiece 138 about the central horizontal spacing (G3). No ions strike the workpiece about the peripheral horizontal spacing (G2) and (G4) proximate the insulators 212 and 214 in this embodiment.

Figure 6:
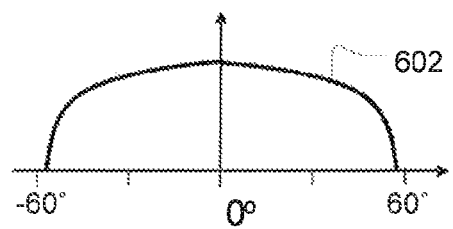
FIG. 6 is a plot of angular ion distributions of the ion trajectories of FIG. 5.

FIG. 6 is a plot 602 of the distribution of incident angles of ions striking the workpiece 138 consistent with the illustrated ion trajectories of FIG. 5. As shown, the plot 602 reveals the incident angles are centered about 0° and vary over a large range of angles from about +60° to −60°. This large range of incident angles enables conformal doping of three dimensional structures. For example, the sidewalls of a trench structure may be more uniformly doped with ions having such a large range of incident angles.

Figure 7:
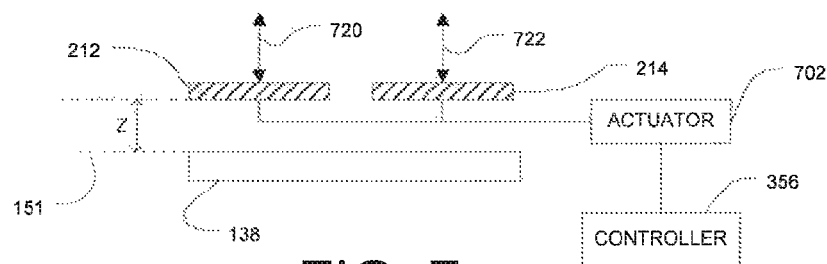
FIG. 7 is a block diagram of a system to control a vertical spacing between a pair of insulators and a workpiece.

Turning to FIG. 7, a block diagram of another embodiment consistent with the present disclosure is illustrated where the vertical spacing (Z) between an insulating modifier and the plane 151 defined by the front surface of the workpiece 138 may be adjusted. The insulating modifier may be the pair of insulators 212 and 214 as detailed in other embodiments. An actuator 702 may be mechanically coupled to the pair of insulators 212 and 214 to drive the insulators in a vertical direction as shown, by arrows 720, 722 relative to the plane 151. The Z position of the pair of insulators 212 and 214 relative to the plane 151, and also relative to each other, influences the shape of the boundary between the plasma and the plasma sheath and also the trajectories of the ions striking the workpiece 138. The actuator 702 may be controlled by a controller such as controller 356.

Figure 8:
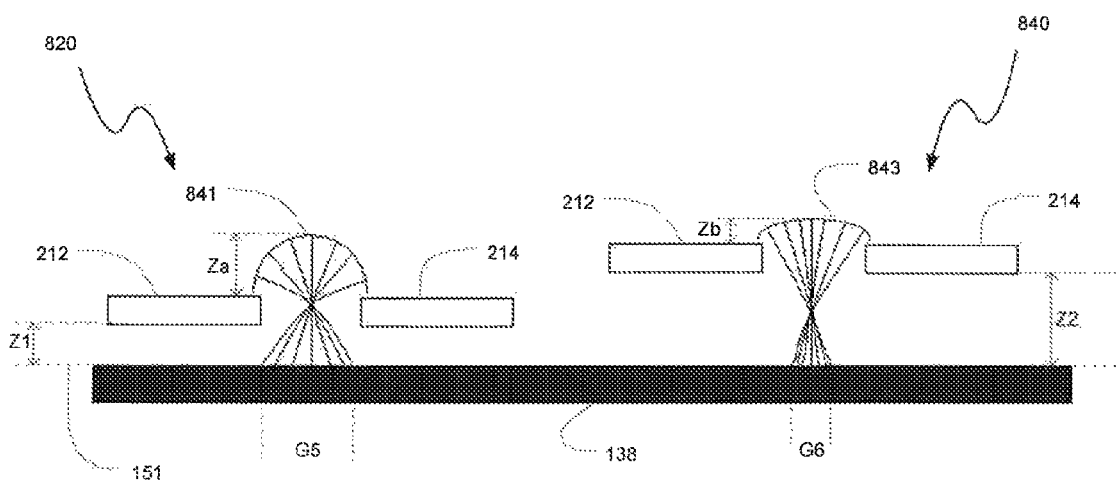
FIG. 8 is a cross sectional view consistent with FIG. 7 illustrating ion trajectories at differing vertical spacing.

FIG. 8 is a cross sectional view consistent with FIG. 7 to illustrate ion trajectories at differing Z positions of the pair of insulators 212 and 214 relative to the plane 151 with all other parameters being equal. In the first relatively short Z gap position 820, the insulators 212, 214 are positioned a first distance (Z1) above the plane 151. In a comparatively taller Z gap position 840, the insulators 212, 214 are positioned a second distance (Z2) above the plane 151, where (Z2)>(Z1).

In the first position 820, the boundary 841 between the plasma and the plasma sheath has a convex shape relative to the plane 151. The boundary 841 also has a shape that approximately approaches the shape of a portion of a circumference of a circle where an apex of the arcuate shape is a distance (Za) above a top surface of the insulator 212. In contrast, the boundary 843 in the second position 840 has a shallower shape where the apex of the arcuate shape is a shorter distance (Zb) above the top surface of the insulator 212, or where (Zb)>(Za). The shape of the boundaries 841, 843 combined, with the Z gap distances (Z1) and (Z2) and the electric field lines in the plasma sheath, influences the angular spread of the ions striking the workpiece 138. For example, the angular spread of ions striking the workpiece 138 with the relatively short Z gap position 820 is greater than the angular spread of ions striking the workpiece 138 with the relatively longer Z gap position. In addition, ions strike a wider horizontal spacing (G5) of the workpiece 138 with the shorter Z gap position 820 compared to the horizontal spacing (G6) with the taller Z gap position, where (G6)>(G5). Although not illustrated in FIG. 8, the Z gap positions of each insulator 212 and 214 may also be different from each other to further influence the shape of the boundary between the plasma and the plasma sheath and accordingly the angular spread of ions.

Figure 9:
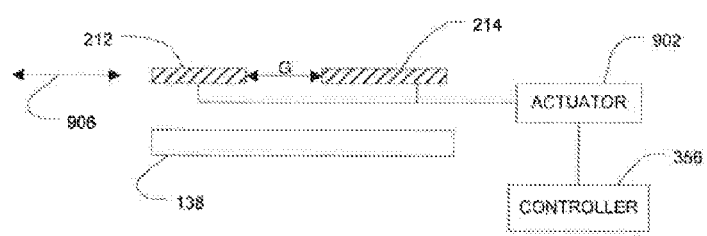
FIG. 9 is a block diagram of a system to control a horizontal spacing between a pair of insulators.

Turning to FIG. 9, a block diagram of another embodiment consistent with the present disclosure is illustrated where the horizontal spacing (G) between insulators 212 and 214 may be adjusted. The horizontal spacing adjustments may in lieu of, or in addition to, the earlier detailed vertical spacing adjustments of FIGS. 8 and 9. An actuator 902 may be mechanically coupled to at least one of the pair of insulators 212 and 214 to drive the insulators in the direction shown by the arrow 906 relative to one another. The actuator 902 may be controlled by a controller such as controller 356.

Figure 10:
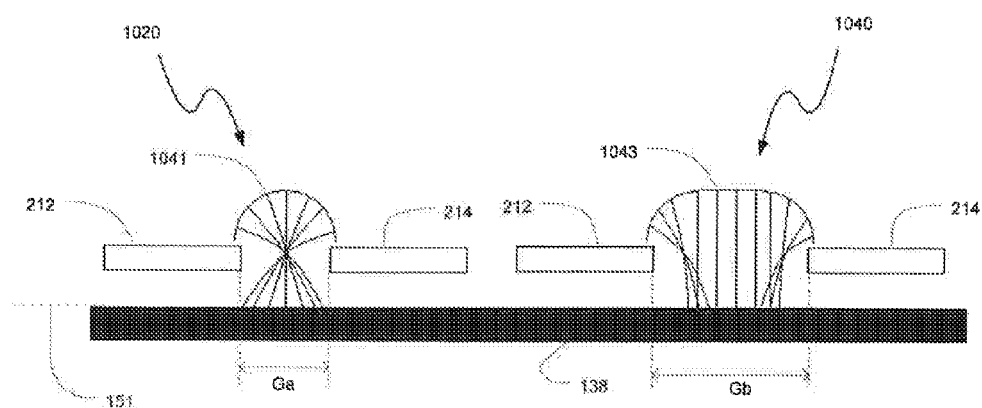
FIG. 10 is a cross sectional view consistent with FIG. 9 to illustrating ion trajectories at differing horizontal spacing.

FIG. 10 is a cross sectional view consistent with FIG. 9 to illustrate ion trajectories at differing horizontal gap spacing between the insulators 212 and 214 with all other parameters being equal. In the first relatively shorter horizontal gap position 1020, the insulators 212, 214 are positioned a first horizontal distance (Ga) from one another. In a comparatively longer horizontal gap position 1040, the insulators 212, 214 are positioned a second horizontal distance (Gb) from each other, where (Gb)>(Ga). In the first position 1020, the boundary 1041 between the plasma and the plasma sheath has a convex shape relative to the plane 151. The boundary 1041 also has a shape that approximately approaches the shape of a portion of a circumference of a circle. In contrast, the boundary 1043 in the second position 1040 has a convex shape relative to the plane 151 where a central portion of the boundary 1043 is about parallel to the plane 151. As a result, a larger corresponding central portion of the workpiece 138 is struck with ions having about a 0° angle of incidence relative to the plane 151.

Figure 11:
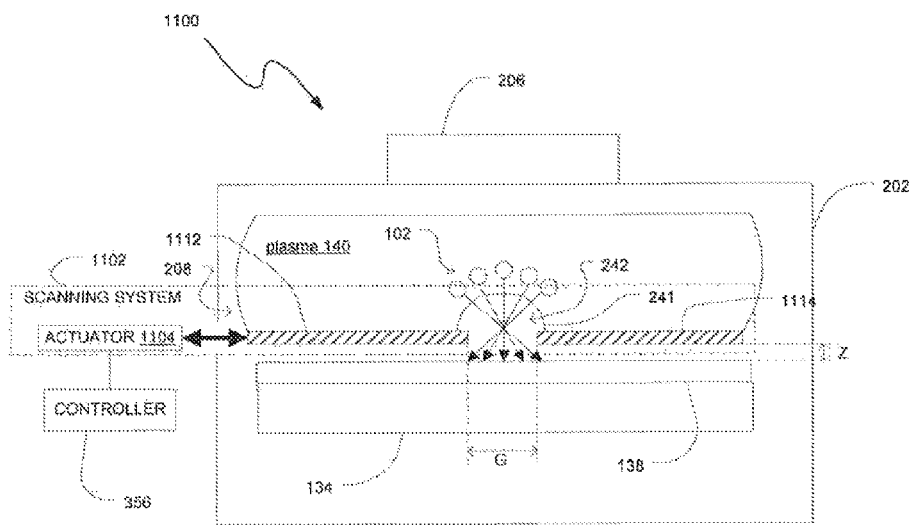
FIG. 11 is a block diagram of a plasma processing apparatus having a scanning system, to move a pair of insulating sheets relative to a workpiece.
Figure 12:
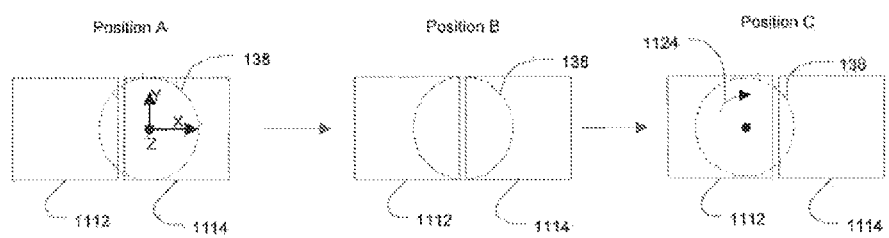
FIG. 12 is a plan view of the insulating sheets of FIG. 11 showing relative movement between the insulating sheets and a disk shaped workpiece.

FIG. 11 is a block diagram of a plasma processing apparatus 1100 having a scanning system 1102 to drive an insulating modifier 208 relative the workpiece 138. In the embodiment of FIG. 11, the insulating modifier 208 includes a pair of square insulating sheets 1112 and 1114 that are best seen in FIG. 12. The scanning system 1102 may include an actuator 1104 mechanically coupled to the insulating sheets 1112 and 1114 to drive the same. The actuator 1104 may be controlled by a controller such as controller 356.

FIG. 12 is plan view of the square insulating sheets 1112 and 1114 and a disk shaped workpiece 138 to illustrate one example of relative movement between the same. In the embodiment of FIG. 12, the scanning system 1102 may drive the square insulating sheets 1112 and 1114 from Position A, to Position B, and Position C, etc. so that all portions of the workpiece 138 are exposed to the gap defined by the pair of square insulating sheets 1112 and 1114. If a Cartesian coordinate system is defined as detailed in FIG. 12, the insulating sheets 1112 and 1114 are driven in the X direction of FIG. 12. In other embodiments, the insulating sheets 1112 and 1114 or another set of different insulating sheets may be driven in the Y direction or any angle between the X and Y directions. In addition, the workpiece 138 may be rotated as the scanning system 1102 drives the insulating sheets 1112 and 1114 in one direction. The workpiece 138 may also be rotated by a predetermined rotation angle after the scanning system 1102 drives the insulating sheets in one direction. In one example, the rotation may be about a central axis of the workpiece as illustrated by arrow 1124.

Figure 13:
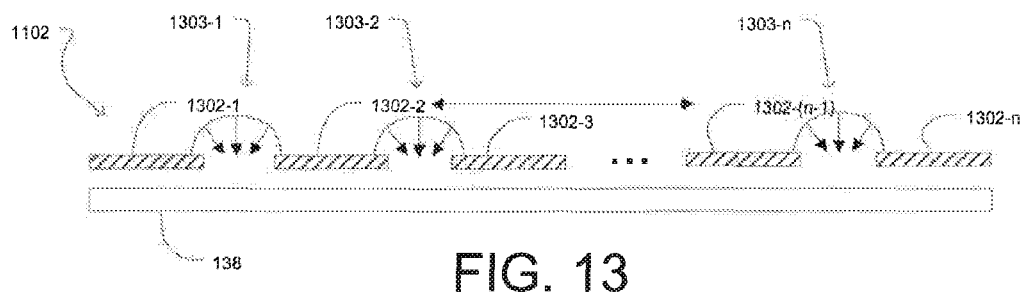
FIG. 13 is a block diagram of a scanning system consistent with FIG. 11 having a plurality of insulators.

Turning to FIG. 13, a scanning system 1102 consistent with FIG. 11 is illustrated. Compared to FIG. 11, the scanning system 1102 of FIG. 13 includes a plurality of insulators 1302-1, 1302-2, 1302-3, . . . 1302-(n−1), and 1302-n that define a plurality of gaps there between 1303-1, 1303-2, . . . 1303-n. The scanning system may drive the plurality of insulators 1302-1, 1302-2, 1302-3, . . . 1302-(n−1), and 1302-n relative to the workpiece 138 so the plurality of gaps 1303-1, 1303-2, . . . 1303-n pass over the workpiece 138.

Figure 14:
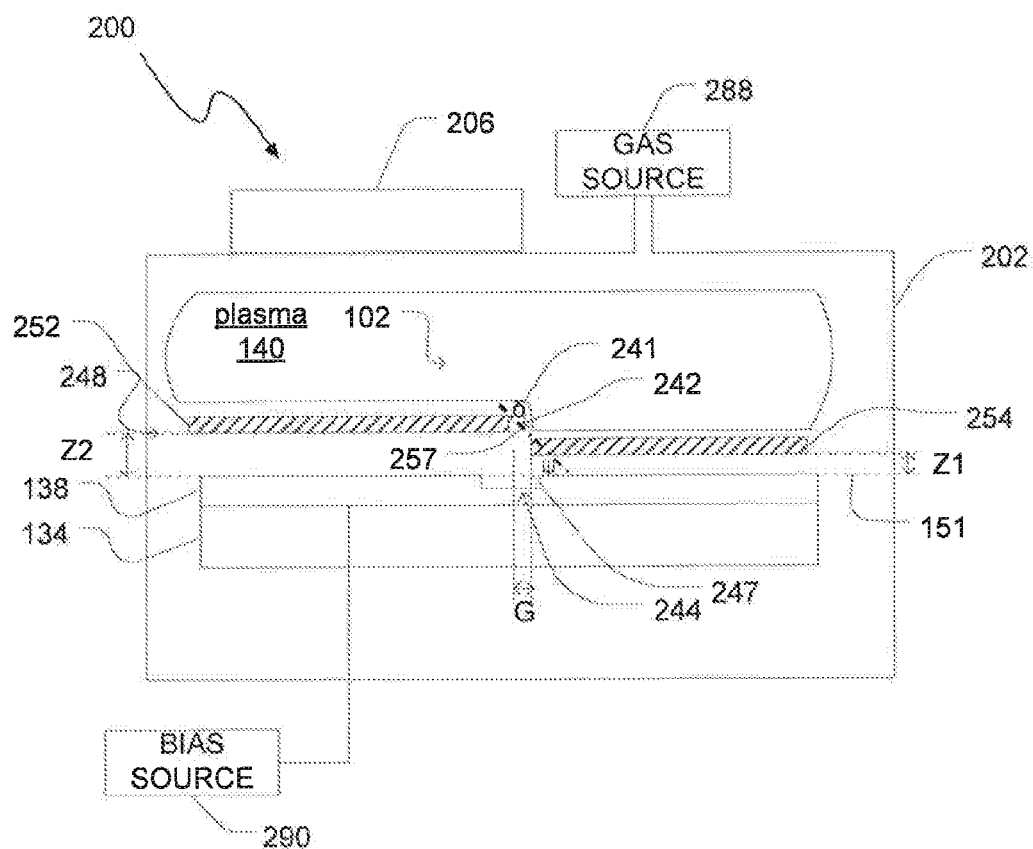
FIG. 14 is a block diagram, of a plasma processing apparatus consistent with a second embodiment, of the disclosure.

FIG. 14 shows a second embodiment of the plasma processing apparatus of FIG. 2. As described above, the plasma processing apparatus 200 may include a process chamber 202, a platen 134, a source 206, and the insulating modifier 248. In the embodiment of FIG. 14, the insulating modifier 248 includes insulators 252 and 254 defining a gap there between having a horizontal spacing (G). In other embodiments, the insulating modifier 248 may include only one insulator. In one embodiment, the horizontal spacing of the gap defined by the insulators 252 and 254 may be between about 1 and 60 millimeters (mm), depending on the sheath thickness and the desired, angular distribution.

The insulators 252 and 254 may also be positioned a vertical spacing (Z1,Z2) above the plane 151 defined by the front surface of the workpiece 138. In one embodiment, the closer vertical spacing (Z1) may be between about 1 and 10 mm. In some embodiments, the difference in height between the insulators (i.e. Z2−Z1) may be between about 0 and 40 mm, depending on the sheath thickness and the desired angular distribution. While FIG. 14 shows insulator 252 at a greater vertical height than insulator 254, the insulator 254 may have a greater vertical height than insulator 252 if desired.

The difference in vertical height between the two insulators creates a gap angle, relative to plane 151. The gap angle is measured by creating a plane 257, which passes though the edges of insulator 252 closest to the sheath and proximate the gap and the edges of insulator 254 closest to the sheath and proximate the gap. The angle between plane 257 and plane 151 defines the gap angle ($\Psi$). In some embodiments, the gap width ($\delta$) is measured along plane 257, rather than along the horizontal. The gap width ($\delta$) is related to the horizontal spacing (G) according to the equation:

$$\delta = G/\cos(\Psi)$$

where $\Psi$ is the gap angle. The gap width ($\delta$) may be between 0 and 40 mm. In some embodiments, the horizontal spacing may be 0 or even negative (which is achieved when the insulators overlap one another). A large difference in Z2−Z1, coupled with a 0 mm or negative horizontal, spacing can be used to create very large center angles, such as greater than 80°.

As will be described in more detail below, the disclosed apparatus can be used to create angular distributions of ions.

Figure 16:
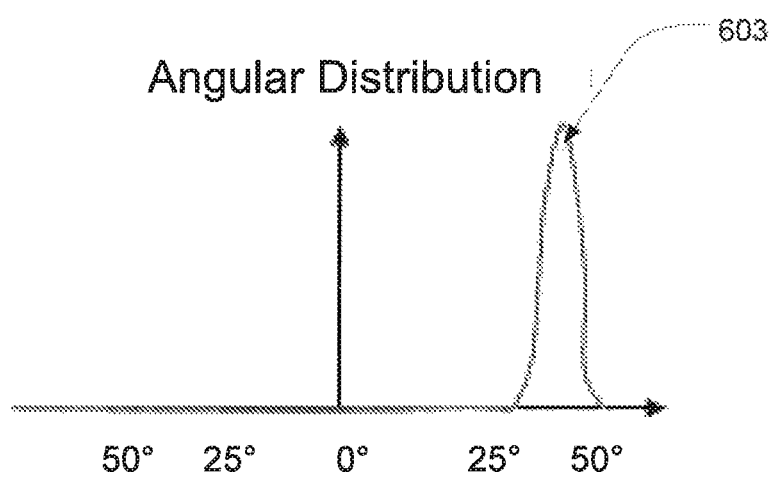
FIG. 16 is a plot of angular ion distributions of the ion trajectories of FIG. 15.
Figure 23:
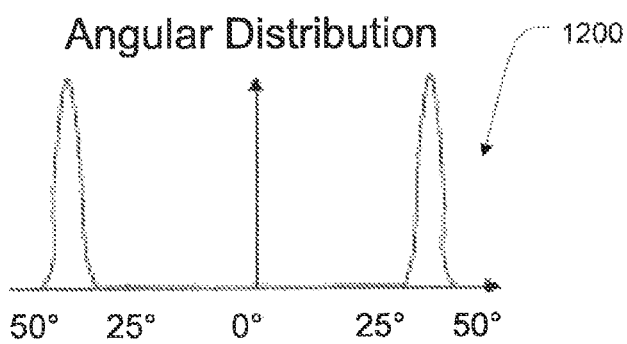
FIG. 23 is a plot of angular ion distributions of the ion trajectories of FIG. 22.

These angular distributions, such as those shown in FIG. 16 and 23, can be characterized by two parameters. The first is the center angle, which is the angle that forms the center of the angular distribution. The center angle is defined as the angular deviation from the orthogonal to plane 151. In other words, ions that strike perpendicular to the plane 151 at said to have a center angle of 0°. As the angle of incidence become more parallel to plane 151, its value increases.

In FIG. 16, the center angle corresponds to about 45°. In FIG. 23, there are two center angles, at −45° and +45°. The second parameter of interest is the angular spread, or angular range. This is the distribution of ions about the center angle. In other words, all ions do not strike the workpiece at the same angle. Rather, they arrive having an angular distribution about the center angle. In FIG. 16, the distribution of angles is roughly from 35° to 55°; thereby having an angular spread (or range) of about 20°. Similarly, the angular spread (or angular distribution) of FIG. 23 is about 20°.

The gap angle ($\Psi$) helps to define the center angle. To create a center angle that is not perpendicular to the workpiece plane 151 (i.e. a non-zero center angle), the gap angle ($\Psi$) may be non-zero. In other words, a non-zero gap angle ($\Psi$) implies that the gap plane 257 is not parallel to the workpiece plane 151. By having a non-zero gap angle ($\Psi$), the center angle is changed so as not to be perpendicular to the workpiece plane 151. Larger gap angles (i.e. >30°) typically create larger deviations in the center angle (i.e. >30°). Smaller gap angles (i.e. when the gap plane 257 and the workpiece plane 151 are nearly parallel) produce smaller center angles (i.e. <10°).

The boundary 241 between the plasma 140 and the plasma sheath 242 may have an irregular shape relative to the plane 151. When the bias source 290 biases the workpiece 138, ions 102 are attracted across the plasma sheath 242 through the gap between the insulators 252 and 254 at a large range of center singles. For instance, ions may strike the workpiece 138 at a non-zero center angle $+\theta°$ relative to the plane 151. If the vertical spacing of the insulators is reversed, ions may strike the workpiece 138 a non-zero center angle of $-\theta°$ relative to the plane 151. Accordingly, the range of incident angles may be centered about $\theta°$, where $\theta$ is between −80° and 80°. Depending on a number of factors including, but not limited to, the horizontal spacing (G) between the insulators 252 and 254, the vertical spacing (Z1, Z2) of the insulators above the plane 151, the gap width ($\delta$), the gap angle ($\Psi$), the difference in vertical spacing (Z2−Z1), the dielectric constant of the insulators 252 and 254, the dielectric thickness of the insulators 252 and 254, and other plasma process parameters, the range and center of the incident angles ($\theta$) may be modified. For example, the angular distribution may be between +5 degrees and −5 degrees, while the center angle can be between −80° and +80°. In other embodiments, the angular distribution may be greater (or smaller). Similarly, the center angle can be modified, to achieve other values. Hence, small three dimensional structures on the workpiece 138 may be treated uniformly by the ions 102.

Figure 15:
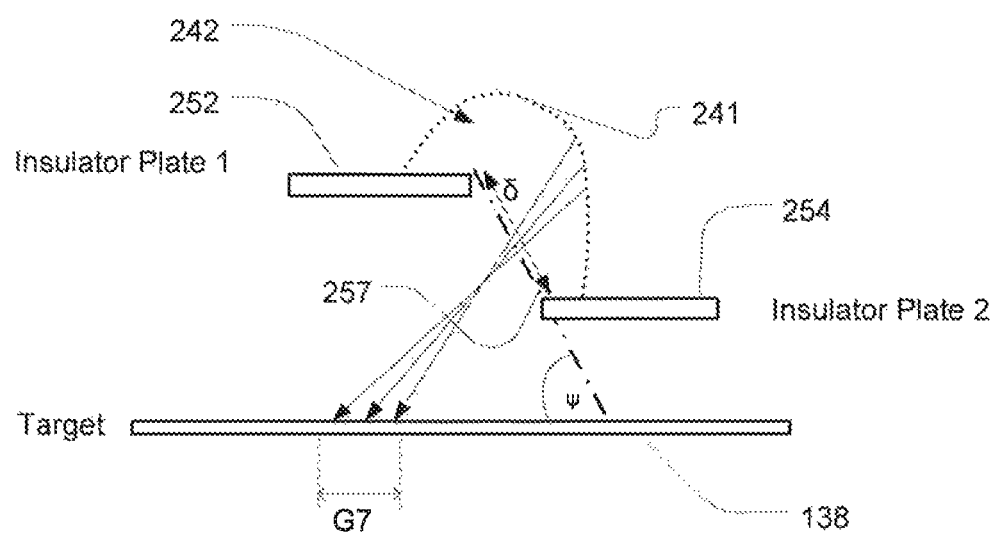
FIG. 15 is a cross sectional view of two insulators used to control a shape of a boundary between a plasma and a plasma sheath.

FIG. 15 is a cross sectional view illustrating simulated ion trajectories accelerated across the plasma sheath 242 through the gap between the insulators 252 and 254. In a plasma doping apparatus, the ions may be implanted in the workpiece 138 in a central area of the gap spacing due to the shape of the boundary 241 and the electric field lines within the plasma sheath 242. For instance, due to the difference in vertical spacing between the two insulators 252, 254, ions strike the workpiece at a non-zero angle in the space (G7). In addition, few ions strike the workpiece proximate the insulators outside of space G7 in this embodiment.

FIG. 16 is a plot 603 of the distribution of incident angles of ions striking the workpiece 138 consistent with the illustrated ion trajectories of FIG. 15. As shown, the plot 603 reveals the incident angles are centered about a non-zero center angle of about 45 degrees with an angular distribution of about 20 degrees about this center angle. In other embodiments, the center angle can vary between −80 to +80 degrees and the angular distribution about the center angle may vary from about +20 to −20 degrees. This range of incident angles enables conformal doping of three dimensional structures.

By varying the gap width ($\delta$), the spacing between the insulators (Z2−Z1) and the position of the insulators with respect to the workpiece (Z1), the center angle and angular distribution can be modified to achieve a wide range of values, including, but not limited to, large center angles (i.e. >60°) with small angular distributions (i.e. <5°), large center angles (i.e. >60°) with large angular distributions (i.e. >10°), small center angles (i.e. <40°) with large angular distributions (i.e. >10°), and small center angles (>40°) with small angular distributions (<5°).

Figure 17:
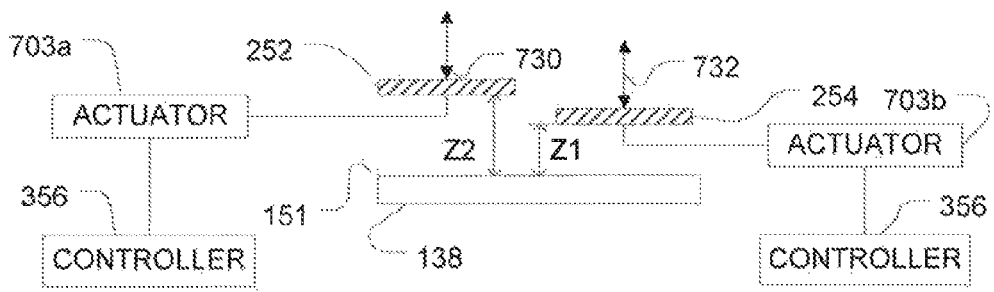
FIG. 17 is a block diagram of a system to control a vertical spacing between a set of insulators and a workpiece.

Turning to FIG. 17, a block diagram of another embodiment consistent with the present disclosure is illustrated where the vertical spacings (Z1,Z2) between an insulating modifier and the plane 151 defined by the front surface of the workpiece 138 may be adjusted. The insulating modifier may be the insulators 252 and 254 as detailed in other embodiments. An actuators 703a,b may be mechanically coupled to the insulators 252 and 254, respectively to drive the insulators in a vertical direction as shown by arrows 730, 732 relative to the plane 151. The Z positions of the insulators 252 and 254 relative to the plane 151, and also relative to each other, influence the shape of the boundary between the plasma and the plasma sheath and also the trajectories of the ions striking the workpiece 138. The actuators 703a,b may be controlled by controllers, such as controllers 356a,b. In other embodiments, a single controller is used to control both actuators 703a,b.

Figure 18:
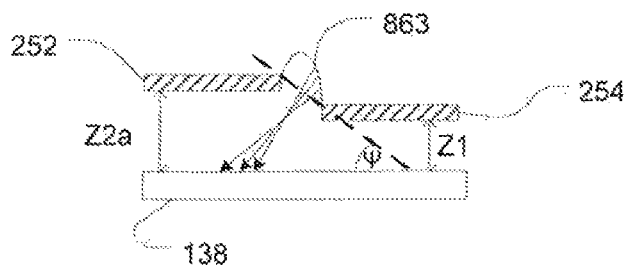
FIG. 18 is a cross sectional view consistent with FIG. 17 illustrating ion trajectories at a first vertical spacing.
Figure 19:
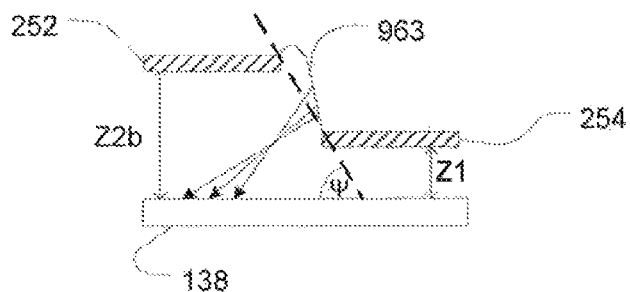
FIG. 19 is a cross sectional view consistent with FIG. 17 illustrating ion trajectories at a second vertical spacing.

FIGS. 18 and 19 are cross sectional views consistent with FIG. 17 to illustrate ion trajectories at differing Z positions of the insulators 252 and 254 relative to the plane 151 with all other parameters being equal. In FIG. 18, the insulators 252, 254 are vertically spaced by a distance of (Z2a−Z1). In FIG. 19, the insulators 252, 254 are positioned using a second vertical spacing (Z2b−Z1), where Z2b>Z2a. Therefore, the gap angle ($\Psi$) is greater in FIG. 19. In FIG. 18, the boundary 863 between the plasma and the plasma sheath has a roughly convex shape relative to the plane 151. In contrast, in FIG. 19, the boundary 963 has a shallower shape. The shape of the boundaries 863, 963 combined with the Z gap distances (Z1) and (Z2a,Z2b), the gap angle ($\Psi$), and the electric field lines in the plasma sheath, influences the center angle of the ions striking the workpiece 138. For example, the center angle of ions striking the workpiece 138 with the relatively short vertical spacing (smaller gap angle) is closer to zero degrees (i.e. closer to striking the workpiece at a perpendicular angle) than the center angle of ions striking the workpiece 138 with the relatively greater vertical spacing (larger gap angle) shown in FIG. 19.

In another embodiment, the vertical spacing between the insulators (Z2−Z1) is maintained, while Z1 is varied. This has the effect of moving the insulators closer (or further) from the workpiece, while maintaining the gap angle ($\Psi$). In this embodiment, the center angle remains constant, while the angular distribution varies as Z1 varies. In some embodiments, the angular distribution increases as Z1 is decreased, while the distribution decreases as Z1 is increased. In other words, for example, one value of Z1 may result in an angular distribution of 5-10° about the center angle, while a smaller value of Z1 may result in an angular distribution of 20-30°. This effect may be due to the change in the shape of the boundary between the plasma and the plasma sheath, which varies as the insulators are moved relative to the workpiece.

Figure 20:
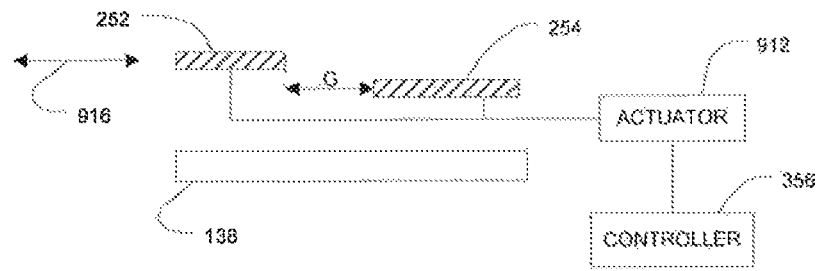
FIG. 20 is a block diagram of a system to control a horizontal spacing between insulators.

Turning to FIG. 20, a block diagram of another embodiment consistent with the present disclosure is illustrated where the horizontal spacing (G) between insulators 252 and 254 may be adjusted. The horizontal spacing adjustments may be in lieu of, or in addition to, the earlier detailed vertical spacing adjustments of FIGS. 18 and 19. An actuator 912 may be mechanically coupled to at least one of the Insulators 252 and 254 to drive the insulators in the direction shown by the arrow 916 relative to one another. The actuator 912 may be controlled by a controller such as controller 356. Modification of the horizontal spacing (G) affects both the gap width (δ) and the gap angle (Ψ).

Figure 21:
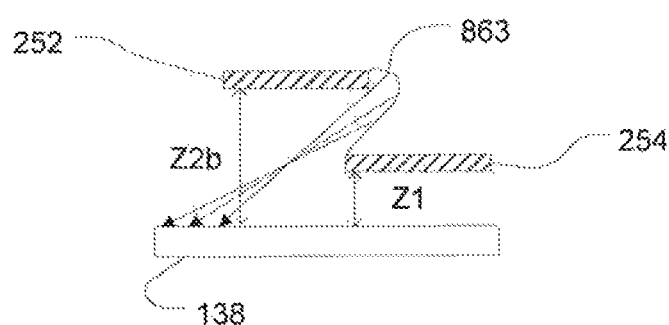
FIG. 21 is a cross sectional view consistent with FIG. 20 to illustrating ion trajectories at negative horizontal spacing.

In one embodiment, the horizontal gap spacing (G) between the insulators is varied. Modification of the horizontal gap spacing can be used to affect both the center angle and the angular distribution. For example, if the horizontal gap spacing is reduced to 0 or made negative by having the insulators overlap, as shown in FIG. 21, the center angle can be made very large. Small positive horizontal gap spacings will result in large gap angles (Ψ), depending on the values of Z2 and Z1, resulting in larger center angles. Large positive horizontal gap spacings will reduce the gap angle (Ψ), resulting in a smaller center angle.

Figure 22:
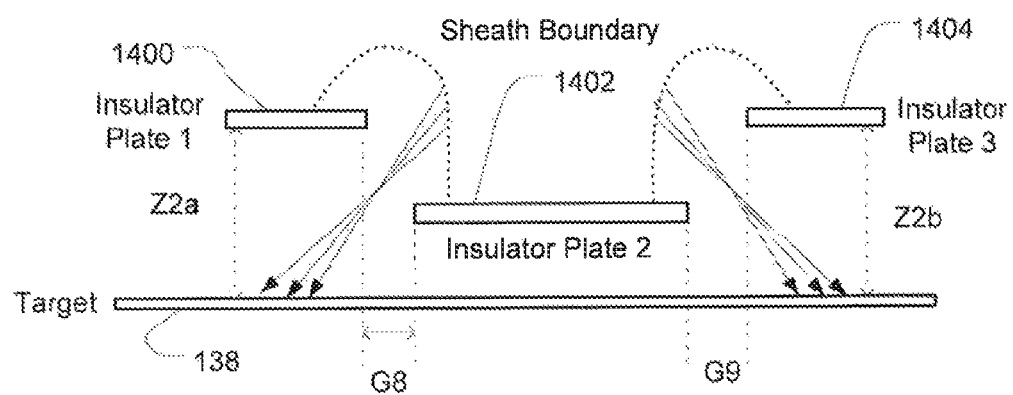
FIG. 22 is a cross sectional view of three insulators used to control a shape of a boundary between a plasma and a plasma sheath.

A bimodal angular spread 1200, such as that shown in FIG. 23, can be created using the configuration shown in FIG. 22. A bimodal angular spread refers to a first center angle having a first angular distribution and a second center angle having a second angular distribution. Such a bimodal angular spread may also be created by changing the relative vertical position of only two insulators such as illustrated in FIG. 15. In the embodiment of FIG. 22, at least three insulators 1400, 1402, 1404 are used. By arranging the outer two insulators 1400, 1404 on the same vertical plane (Z2), and maintaining the same horizontal spacing G8, G9 between the insulators, it is possible to create a symmetric bimodal angular spread 1200, centered about +/−θ°. As described above, the center angles can be modified by varying the vertical spacing between the outer insulators 1400, 1404 and the middle insulator 1402, so as to vary the gap angles (Ψ). The angular spread can be modified by varying the horizontal spacing (G8, G9) between the insulators 1400, 1402, 1404, so as to vary the gap width (δ). An asymmetric distribution can be created by making Z2a different than Z2b, by choosing G8 different than G9, or a combination of both actions.

Figure 24:
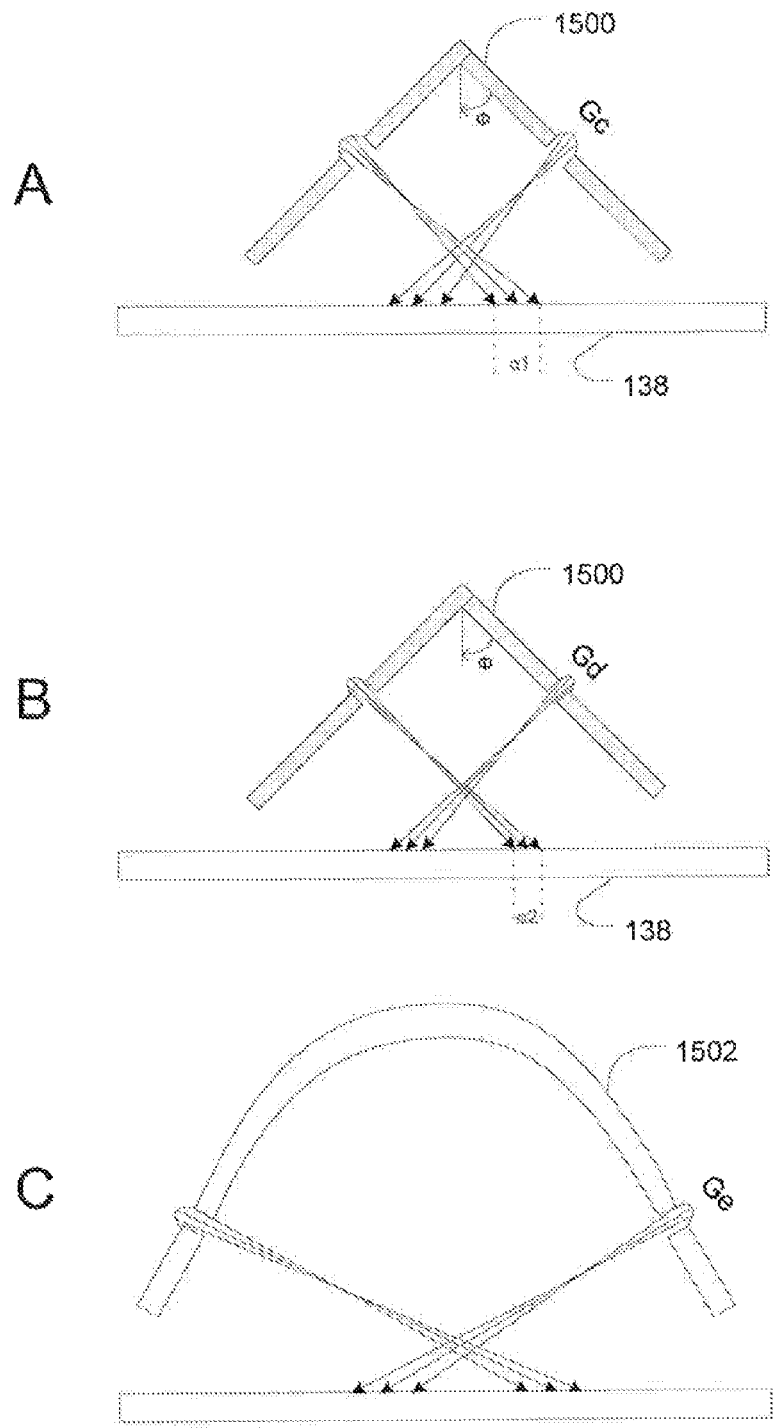
FIGS. 24a-c are cross sectional views of additional embodiments of the insulating modifier.

While the previous embodiments show the insulators as being planar, this is not a requirement of the disclosure. FIG. 24a-c shows several other embodiments of the insulators. FIG. 24a shows an inverted "V" shaped insulator configuration. As described above, the plasma sheath follows the shape of the insulator. Therefore, the sheath forms a corresponding inverted "V" shape. Gaps in the insulator 1500 allow ions to pass through the insulator. The slope of the inverted "V", as defined by Φ, defines the center angle of the ion distribution. The gap angle (Ψ) in this embodiment would be the complement of Φ. The gaps Gc, Gd define the angular spread α1, α2, respectively. As can be seen when FIG. 24a and FIG. 24b are compared, a larger gap width (such as Gc) allows a greater angular spread, than the narrower gap width Gd (i.e. α1>α2). FIG. 24c illustrates another embodiment, in which the insulator 1502 is non-linear, curved or curvilinear, such that the gap width Ge is at an angle to the workpiece 138. As explained above, the gap angles determine the center angle, while the widths of the gaps determine the angular spread.

Other embodiments are also possible and within the scope of the disclosure. For example, in some embodiments, two or more insulators are used, where they are spaced apart so as to create a gap between them. This gap between the insulators allows ions to pass through to a workpiece. In other embodiments, a single insulator is used, which has at least one opening or gap in it, through which ions may pass.

There are several considerations when developing a system. A higher gap angle (Ψ) results in a greater center angle of the ion distribution. The length of the opening along plane 257 defines the width of the gap (δ). The gap width (δ) affects the angular spread of the ion distribution. It is important to note that these two variables are independent of one another. In other words, the gap angle (Ψ) can be modified without changing the gap width (δ). Similarly, the gap width (δ) can be changed without affecting the gap angle (Ψ). Another variable of interest is the distance from the gap (or either insulator) to the workpiece 138. Again, this variable can be changed independent of the other two variables. Use of independent horizontal and vertical actuators (see FIGS. 17 and 20) allow maximum flexibility in determining these parameters.

Figure 25:
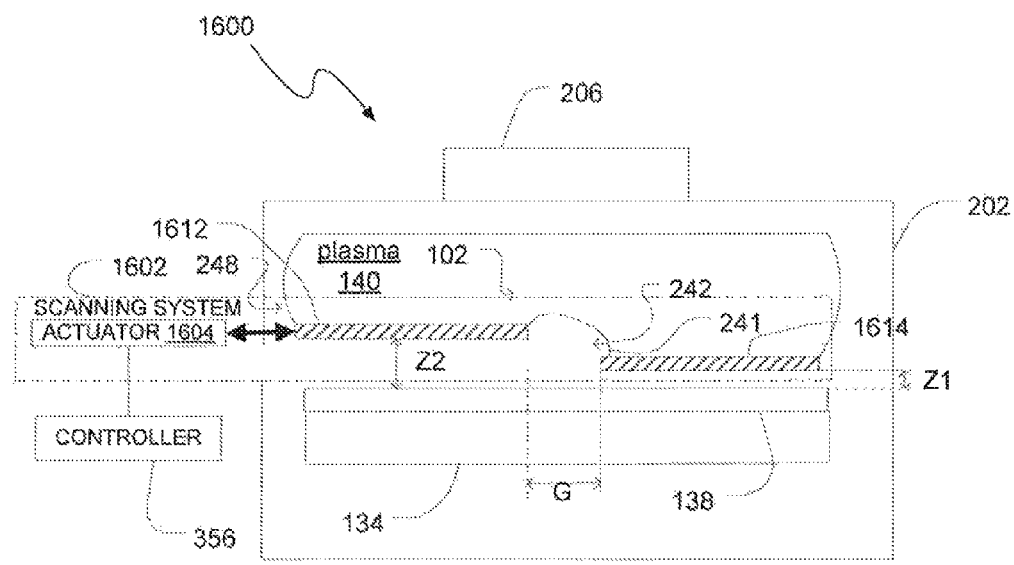
FIG. 25 is a block diagram of a plasma processing apparatus having a scanning system to move insulating sheets relative to a workpiece.
Figure 26:
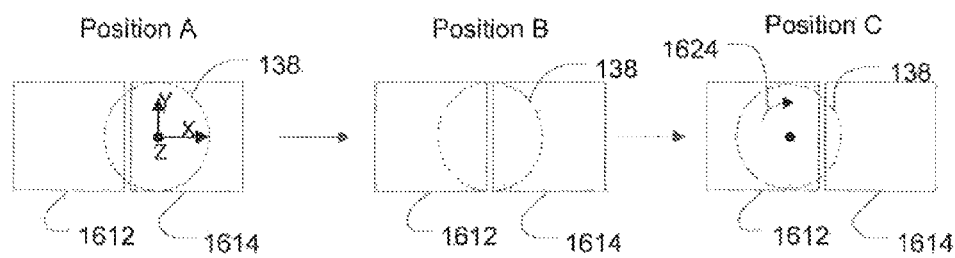
FIG. 26 is a plan view of the insulating sheets of FIG. 25 showing relative movement, between the insulating sheets and a disk shaped workpiece.

FIG. 25 is a block diagram of a plasma processing apparatus 1600 having a scanning system 1602 to drive an insulating modifier 248 relative the workpiece 138. In the embodiment of FIG. 25, the insulating modifier 248 includes square insulating sheets 1612 and 1614 that are best seen in FIG. 26. The scanning system 1602 may include one or more actuators 1604 mechanically coupled to the insulating sheets 1612 and 1614 to drive the same in both the vertical and horizontal directions. The actuator 1604 may be controlled by a controller such as controller 356.

FIG. 26 is plan view of the square insulating sheets 1612 and 1614 and a disk shaped workpiece 138 to illustrate one example of relative movement between the same. In the embodiment of FIG. 26, the scanning system 1602 may drive the square insulating sheets 1612 and 1614 from Position A, to Position B, and Position C, etc. so that all portions of the workpiece 138 are exposed to the gap defined by the square insulating sheets 1612 and 1614. If a Cartesian coordinate system is defined as detailed in FIG. 26, the insulating sheets 1612 and 1614 are driven in the X direction of FIG. 26. In other embodiments, the insulating sheets 1612 and 1614 or another set of different insulating sheets may be driven in the Y direction or any angle between the X and Y directions. In addition, the workpiece 138 may be rotated as the scanning system 1602 drives the insulating sheets 1612 and 1614 in one direction. The workpiece 138 may also be rotated by a predetermined rotation angle after the scanning system 1602 drives the insulating sheets in one direction. In one example, the rotation may be about a central axis of the workpiece as illustrated by arrow 1624.

Although the scanning system of FIG. 25 is shown with two insulating plates at a vertical spacing from one another, other embodiments are possible. For example, the scanning system can be made using three insulating plates, thereby creating two gaps, as shown in FIG. 22. Additionally, the alternate shapes, such as those shown in FIG. 24 can be used in the scanning system. Furthermore, the patterns shown in these figures can be replicated, such that there are multiple gaps across the width or length of the workpiece. In some embodiments, all gaps produce the same angular distribution (as shown in FIG. 15-16). In other embodiments, the gaps produce opposite distributions at +/−θ° (as shown in FIG. 22-23). In other embodiments, the gaps are used to produce varied angular distributions. In this embodiment, the final angular distribution experienced by the workpiece would be the sum of the various angular distributions.

Figure 27:
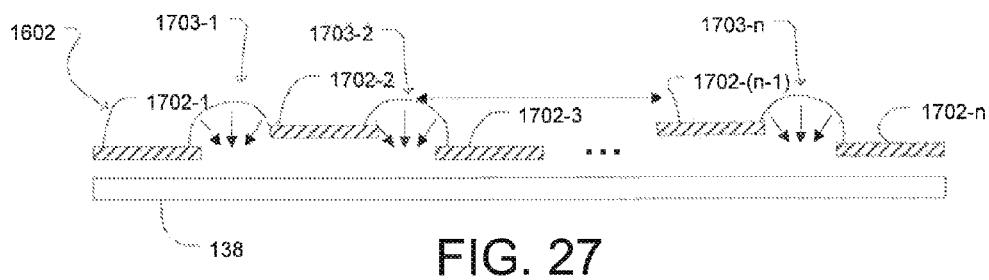
FIG. 27 is a block diagram of a scanning system, consistent with FIG. 25 having a plurality of insulators.

Turning to FIG. 27, a scanning system 1602 consistent with FIG. 25 is illustrated. Compared to FIG. 25, the scanning system 1602 of FIG. 27 includes a plurality of insulators 1702-1, 1702-2, 1702-3, . . . 1702-(n−1), and 1702-n that define a plurality of gaps there between 1703-1, 1703-2, . . . 1703-n. The scanning system may drive the plurality of insulators 1702-1, 1702-2, 1702-3, . . . 1702-(n−1), and 1702-n relative to the workpiece 138 so the plurality of gaps 1703-1, 1703-2, . . . 1703-n pass over the workpiece 138.

Modification of the gap angle (Ψ) can be done by varying the gap spacing, or by varying the vertical spacing (Z2−Z1). Changes to gap angle may affect the center angle. Modification of the angular distribution can be done by varying the height of the insulators (Z1) or by changing the gap spacing. Modifications to all three parameters (Z2, Z1) and gap spacing can be employed to create a desired center angle with a desired angular distribution or spread.

In addition, it may be beneficial or advantageous to cool the insulators 252 and 254. In some embodiments, these insulators may have channels embedded in them, whereby fluid, such as liquid or gas, may pass through, to remove heat. In other embodiments, the insulators may be good thermal conductors and may be in contact with a thermal sink.

Accordingly, there is provided an insulating modifier to control a shape of the boundary between the plasma and the plasma sheath. The incident angles of particles that are attracted from the plasma across the plasma sheath may therefore strike an associated workpiece at a large range of incident angles. The center angle of the distribution may not be perpendicular to a workpiece plane defined by a front surface of the workpiece, and can be modified through proper placement of the insulating modifier. Similarly, the angular spread about the center angle can be modified. In one instance, the range of center angles may as great as between +80° and −80°. The spread may be as great as 10-20°. In a plasma doping application, small three dimensional structures on the workpiece may be more uniformly doped. For example, the sidewalls 247 of a trench 244 (see FIG. 2) may be more uniformly doped compared to a conventional plasma doping apparatus with a much lower range of incident angles.

The present disclosure is not to be limited in scope by the specific embodiments described herein. Indeed, other various embodiments of and modifications to the present disclosure, in addition to those described herein, will be apparent to those of ordinary skill in the art from the foregoing description, and accompanying drawings. Thus, such other embodiments and modifications are intended to fall within the scope of the present disclosure. Further, although the present, disclosure has been described herein in the context of a particular implementation in a particular environment for a particular purpose, those of ordinary skill in the art will recognize that its usefulness is not limited, thereto and that, the present disclosure may be beneficially implemented, in any number of environments for any number of purposes. Accordingly, the claims set forth below should be construed in view of the full breadth and spirit of the present disclosure as described herein.

What is claimed is:

1. A plasma processing apparatus comprising:
a process chamber;
a platen for supporting a workpiece;
a source configured to generate a plasma in said process chamber having a plasma sheath;
an insulating modifier, having a gap therein, wherein a gap plane is defined by portions of said insulating modifier closest to said sheath and proximate said gap, and a gap angle is an angle between said gap plane and a workpiece plane defined by a front surface of the workpiece facing the plasma, and wherein said gap angle is non-zero; and
a bias source configured to accelerate ions from the plasma across the plasma sheath towards the workpiece for treating the workpiece, wherein a range of incident angles of the ions relative to the workpiece plane is dependent on a shape of a boundary between the plasma and the plasma sheath, and wherein said range of incident angles comprises a center angle and an angular distribution about said center angle, and said center angle is not perpendicular to said workpiece plane.

2. The plasma processing apparatus of claim 1, wherein the insulating modifier comprises at least a first insulator and a second insulator, having the gap there between, wherein said gap plane is defined by a first edge of said first insulator, whereby said first edge is on a side of said first insulator nearest said plasma and is proximate said gap, and a second edge of said second insulator, whereby said second edge is on a side of said second insulator nearest said plasma and proximate to said gap.

3. The plasma processing apparatus of claim 2, wherein said first insulator and second insulator comprise insulating sheets.

4. The plasma processing apparatus of claim 2, further comprising an actuator mechanically coupled to at least one of said insulators to adjust a horizontal spacing of said gap.

5. The plasma processing apparatus of claim 2, further comprising an actuator mechanically coupled to at least one of said insulators to adjust a vertical spacing between said first insulator and said second insulator.

6. The plasma processing apparatus of claim 2, wherein said first and second insulators are fabricated of quartz.

7. The plasma processing apparatus of claim 2, further comprising a scanning system configured to move said insulators relative to the workpiece.

8. The plasma processing apparatus of claim 1, wherein said insulating modifier comprises at least a first insulator, a third insulator and a second insulator positioned between said first and third insulators, said three insulators defining two gaps there between, and wherein said first and said third insulator have a first vertical spacing from the workpiece plane, and the second insulator has a second vertical spacing from the workpiece plane, wherein said second vertical spacing is different from said first vertical spacing.

9. The plasma processing apparatus of claim 1, Wherein said insulating modifier comprises a first insulator and a second insulator, each having first and second ends, wherein said second end of said first insulator and said first end of said second insulator are in contact and are positioned at angles with respect to one another, wherein at least one of said insulators comprises a gap therein.

10. A method of treating a workpiece comprising:
generating a plasma having a plasma sheath;
modifying a shape of a boundary between the plasma and the plasma sheath with an insulating modifier; and
accelerating ions from the plasma across the plasma sheath towards the workpiece, wherein a range of incident angles of the ions relative to a workpiece plane defined by a front surface of the workpiece facing the plasma is dependent on the shape of the boundary between the plasma and the plasma sheath, and wherein said range of incident angles of the ions comprises a center angle and an angular distribution about said center angle and wherein said center angle is not perpendicular to the workpiece plane.

11. The method of claim 10, wherein said insulating modifier comprises a gap therein, wherein a gap plane is defined by portions of said modifier closest to said sheath and proximate said gap, and a gap angle is defined as an angle between said gap plane and the workpiece plane, and wherein said gap angle is non-zero.

12. The method of claim 11, wherein said insulating modifier comprises a first and second insulator, and said modifying operation comprises creating said gap between said first and said second insulator.

13. The method of claim 12, further comprising adjusting a horizontal spacing of said gap.

14. The method of claim 13, further comprising adjusting a vertical spacing between said first and second insulators.

15. The method of claim 12, further comprising adjusting a vertical spacing between the first insulator and the workpiece.

16. The method of claim 12, wherein the modifying operation comprises creating the gap between said first and said second insulator, and wherein said angular distribution is determined by a vertical spacing between said first insulator and said workpiece, a vertical spacing between said first insulator and said second insulator, and a horizontal spacing between, said first insulator and said second insulator.

17. The method of claim 16, wherein said center angle is determined by the vertical spacing between said first insulator and said second insulator, and the horizontal spacing between said first insulator and said second insulator.

* * * * *